United States Patent [19]

Itoh et al.

[11] Patent Number: 4,721,535
[45] Date of Patent: Jan. 26, 1988

[54] SOLAR CELL

[75] Inventors: Haruo Itoh, Hino; Toshikazu Shimada, Kokubunji; Shin-ichi Muramatsu, Higashiyamato; Sunao Matsubara, Tokorozawa; Nobuo Nakamura, Hachioji, all of Japan

[73] Assignee: Director-General of the Agency of Industrial Science & Technology, Tokyo, Japan

[21] Appl. No.: 892,286

[22] Filed: Aug. 4, 1986

[30] Foreign Application Priority Data

Aug. 7, 1985 [JP] Japan .................. 60-172511

[51] Int. Cl.⁴ ............................................ H01L 31/06
[52] U.S. Cl. ..................................... 136/258; 136/249; 357/30; 357/59; 437/110; 148/DIG. 160
[58] Field of Search ................ 136/258 AM; 357/30, 357/59 C

[56] References Cited

U.S. PATENT DOCUMENTS 4,492,810  1/1985  Ovshinsky et al. ............ 136/255
4,598,164  7/1986  Tiedje et al. ..................... 136/249

OTHER PUBLICATIONS

G. H. Doehler, "Solid State Superlattices", *Scientific American*, vol. 249, pp. 144–151 (1983).
B. Abeles et al, Phys. Rev. Letts, vol. 51 (No. 21), pp. 2003–2007 (Nov. 1983).

*Primary Examiner*—Aaron Weisstuch
*Attorney, Agent, or Firm*—Antonelli, Terry & Wands

[57] ABSTRACT

A solar cell including at least a thin film formed of an amorphous silicon material and having p-type conductivity. The thin film comprises a multi-layer structure including at least one non-doped layer formed of a material of an amorphous silicon material and having a thickness of 10 to 300 Å and at least one p-type doped amorphous silicon layer of a given thickness. The p-type doped amorphous silicon layer is stacked such that at least one face thereof is in contact with said at least one non-doped layer of amorphous silicon material so that the thin film of multi-layer structure exhibits in effect p-type conductivity.

1 Claim, 3 Drawing Figures

SOLAR CELL

BACKGROUND OF THE INVENTION

The present invention generally relates to a solar cell. More particularly, the invention concerns a solar cell of an amorphous silicon material in which a semiconductor thin film of a superlattice structure is used and which exhibits a high photoelectric conversion efficiency.

Owing to remarkable progress in the field of crystal growth technology and amorphous thin film growth technology, it is now possible to realize a so-called ultra-thin film having a thickness (on the order of 10 to 100 Å) substantially equivalent to the electron wavelength (de Broglie wavelength). In such ultra-thin films, two-dimensional electric conduction which cannot be seen in a bulk semiconductor occurs. By making use of this feature, various applications of the ultra-thin film are reported (reference may be made, for example, to Hirose et al.'s article titled "Semiconductor Superlattice and Photoelectric Process" contained in "Data No. 425 of 111-th Investigation Meeting of 125 Committee of Japan Learning and Study Advancement Society", pp. 13–18). For practical applications, it has been proposed to utilize superlattice structures by doping the superlattice structure with various types of impurities such as an impurity for controlling conductivity type, an impurity for forming a deep level, an impurity for producing a luminescent center, and others.

However, no consideration has heretofore been given to the impurity distribution and optimization thereof within the ultra-thin film itself as well as in the layers of the superlattice structure. In practice, investigations do not go beyond the control of potential distribution in the thickness direction, i.e. control of the depletion layer and quantization levels within a potential well.

In the hitherto known solar cells of amorphous silicon type semiconductors, it is necessary to realize the p-type layer in a thickness smaller than 100 Å in order to obtain sufficiently high short-circuit current, thereby giving rise to the problem that the open-circuit voltage is low when compared with a thick film solar cell. In the case of the thick film cell, a sufficiently high short-circuit current can be generated by widening the optical gap by increasing the amount of carbon added to the silicon, which, however, causes the doping effect of boron to be lowered to decrease the photoconductivity, whereby the photoelectric conversion efficiency is correspondingly reduced. In other words, great difficulty has been encountered in the attempts to increase the short-circuit current, the photoelectric conversion efficiency, and the open-circuit voltage. Parenthetically, in the hitherto known pin-type amorphous silicon solar cell, the short-circuit current density is typically 16 mA/cm$^2$, the open-circuit voltage is typically 0.85 volts, and the photoelectric conversion efficiency is typically 9.5%.

SUMMARY OF THE INVENTION

An object of the present invention is to provide a solar cell structure which can provide a high open-circuit voltage, a large short-circuit current, and a high photoelectric conversion efficiency by using a layer of an amorphous silicon material containing amorphous silicon as a main component thereof, such as an amorphous silicon carbide layer.

Investigations have been made concerning the differences in the characteristics between a thin film and a thick film both formed of an amorphous silicon material and it has been found that in the thin film or multi-layer thin film of the amorphous material, the effective radius of donors and acceptors produced by impurity doping for controlling the conductivity type is in the range of 30 to 100 Å; although it differs in dependence on the type of film material and the impurity. In view of this fact, it has been considered that significant differences would exist between the electron state of the impurity atom in the thin film which has a thickness smaller than the effective radius mentioned above and in which the region doped with the impurity lies at a distance approximately equal to the effective radius from the surface or interface and the thick film in which the region doped with the impurity is located at a distance greater than the effective radius from the surface or interface. After further investigation, it has been discovered that in the ultra-thin film and the superlattice structure having a thickness on the order of the aforementioned effective radius, deterioration of characteristics, such as variation of energy level, lowering of activation rate, and increasing of recombination rate is likely to take place.

Accordingly, an attempt has been made to dope the p-type amorphous silicon layer or silicon carbide layer with impurities in a region located at a distance greater than the effective radius from the surface of the thin film or interface of the multi-layer thin film and it was found that the deteriorations of characteristics such as mentioned above can be effectively prevented. As a practical example of the multi-layer thin film, a structure in which a p-type amorphous silicon layer containing a p-type impurity is interposed between two non-doped amorphous silicon layers each having a thickness in a range of 10 to 300 Å was realized. It was confirmed that the multi-layer thin film thus realized exhibits in effect p-type conductivity. Finally, amorphous silicon series solar cells exhibiting high photoelectric conversion efficiency could be implemented by using the thin film of the structure described above.

It should be mentioned here that the term "amorphous" is intended to encompass those amorphous materials which may contain a trace amount of micro crystalline silicon and which may be regarded to be amorphous in substance.

DESCRIPTION OF THE PREFERRED EMBODIMENTS

Now, the invention will be described in conjunction with exemplary embodiments thereof.

EXAMPLE 1

Figure 1:
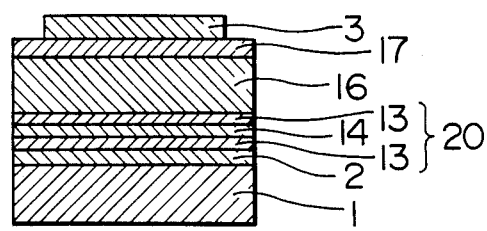
FIG. 1 is a sectional view of a solar cell realized according to a first example of the invention.

Description will be made by referring to FIG. 1.

At first, an electrically conductive light-transmissive film 2 composed of two layers of indium tin oxide and SnO$_2$, respectively, was formed on a glass substrate 1. On the film 2, layers 13 and 14 of amorphous silicon carbide (SiC) were deposited through a high-frequency plasma decomposition of a gas mixture of monosilane and methane gases to form a multi-layer thin film 20. Doped amorphous SiC layer 14 containing B (boron) was formed by admixing 0.5 ppm of $B_2H_6$. This layer is of p-type conductivity. The thickness of the doped amorphous SiC layer 14 is 20 Å and that of each of the undoped amorphous SiC layers 13 is 40 Å. The multilayer film 20 of amorphous silicon carbide thus formed exhibits p-type conductivity as a whole (i.e. as a laminate including the amorphous SiC layers 13, 14, 13). The activation energy of the film 20 is 0.4 eV, and the conductivity is $1 \times 10^{-5}$ $(\Omega.cm)^{-1}$.

Next, an i-type film 16 of Si:H and an n-type film 17 of micro crystalline Si were sequentially formed on the multi-layer film 20 in this order. Finally, am electrode 3 of Ag was formed on the film or layer 17 by a vapor deposition method to complete a solar cell.

The solar cell exhibits a high open-circuit voltage of 0.95 V, while the photoelectric conversion efficiency thereof is 10.8%.

It should be mentioned that even when one of the amorphous SiC layers 13 is absent, the desired effect can be attained.

EXAMPLE 2

Figure 2:
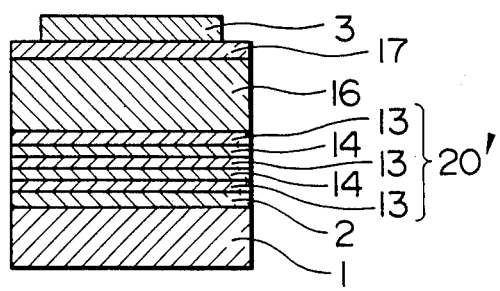
FIG. 2 is a sectional view of a solar cell realized according to a second example of the invention.

Reference is made to FIG. 2.

As is with the case of the Example 1, an undoped amorphous SiC layer 13 was formed on the electrically conductive light-transmissive film 2 formed on the substrate 1, being followed by deposition of a p-type amorphous layer 14 doped with B (boron). Formed on the layer 14 was an undoped amorphous SiC layer 13 on which a p-type doped amorphous SiC layer 14 and an undoped amorphous SiC layer 13 were deposited to form an amorphous silicon multi-layer thin film 20'. Subsequently, an i-type film 16 of Si:H, an n-type film 17 of micro crystalline Si and an electrode 3 of Ag were sequentially formed on the film 20' in this order to complete a solar cell. The open-circuit voltage of this solar cell is 0.94 V and the photoelectric conversion efficiency is 10.6%.

EXAMPLE 3

Figure 3:
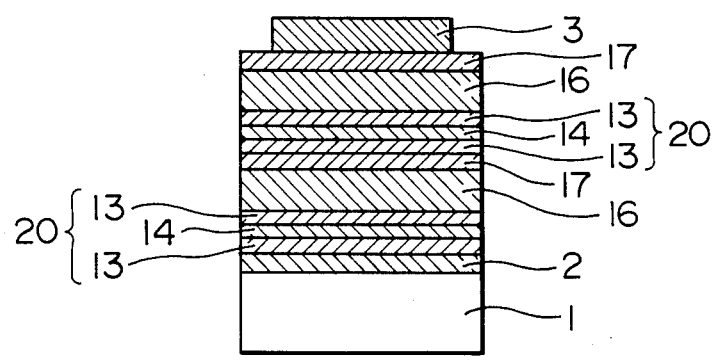
FIG. 3 is a sectional view of a solar cell realized according to a third example of the invention.

Referring to FIG. 3, multi-layer structures each comprising the multi-layer thin film 20, the i-type film 16 of Si:H and the n-type film 17 of micro crystalline Si as in the case of the Example 1 were stacked in duplicate and mounted on the electrically conductive light-transmissive film 2 formed on the substrate 1, being followed by deposition of an electrode 3 of Ag on the top to complete a solar cell.

The open-circuit voltage of this solar cell is 1.9 V and the photoelectric conversion efficiency thereof is 11.0%.

In the examples described above, the amorphous silicon carbide (SiC) layer may be replaced by other amorphous silicon materials such as a compound of silicon and a column IV element and silicon nitride, to substantially the same effect. In the case of the structures according to the Examples 2 and 3, combinations of the materials mentioned above may be employed.

Satisfactory results are obtained in the thickness range of 10 to 300 Å of the undoped amorphous SiC film 13.

As will now be understood, in the amorphous silicon solar cells according to the invention, electric conduction characteristics equivalent to or exceeding those of a thick film can be attained by using the multi-layer film of p-conductivity type. Thus, a solar cell exhibiting a high open-circuit voltage and an increased photoelectric conversion efficiency can be realized.

We claim:

1. A solar cell comprising at least a thin film having p-type conductivity, wherein said thin film is realized in a multi-layer structure including at least one non-doped layer formed of amorphous silicon carbide or nitride and having a thickness of 10 to 300 Å and at least one p-type doped amorphous silicon carbide or nitride layer of a given thickness, said p-type doped amorphous silicon carbide or nitride layer being stacked such that at least one face thereof is brought into contact with said non-doped layer or amorphous silicon carbide or nitride so that said thin film of multi-layer structure exhibits, in effect, p-type conductivity.

* * * * *